(12) United States Patent
Terasawa et al.

(10) Patent No.: US 8,779,974 B2
(45) Date of Patent: Jul. 15, 2014

(54) PIEZOELECTRIC OSCILLATOR, GPS RECEIVER DEVICE, AND ELECTRONIC APPARATUS

(75) Inventors: Katsuyoshi Terasawa, Shiojiri (JP); Manabu Oka, Minowa (JP)

(73) Assignee: Seiko Epson Corporation (JP)

( * ) Notice: Subject to any disclaimer, the term of this patent is extended or adjusted under 35 U.S.C. 154(b) by 652 days.

(21) Appl. No.: 13/094,130

(22) Filed: Apr. 26, 2011

(65) Prior Publication Data

US 2011/0273333 A1    Nov. 10, 2011

(30) Foreign Application Priority Data

May 7, 2010   (JP) .................................. 2010-107016

(51) Int. Cl.
    *G01S 19/24*    (2010.01)
(52) U.S. Cl.
    USPC ...................................................... 342/357.63
(58) Field of Classification Search
    USPC ...................................................... 342/357.63
    See application file for complete search history.

(56) References Cited

U.S. PATENT DOCUMENTS

| 2004/0230333 A1* | 11/2004 | Oka | 700/117 |
| 2009/0230486 A1* | 9/2009 | Shimodaira | 257/415 |
| 2010/0244630 A1* | 9/2010 | Wada | 310/340 |

FOREIGN PATENT DOCUMENTS

| JP | 07-273546 | 10/1995 |
| JP | 2002-033623 A | 1/2002 |
| JP | 2003-163542 | 6/2003 |
| JP | 2009-290379 | 12/2009 |

\* cited by examiner

*Primary Examiner* — Harry Liu
(74) *Attorney, Agent, or Firm* — Harness, Dickey & Pierce, P.L.C.

(57) ABSTRACT

A piezoelectric oscillator includes: a piezoelectric resonator; a storage unit that stores temperature compensation data used for specifying frequency-temperature characteristics of the piezoelectric resonator therein; a temperature compensation circuit; a voltage-controlled oscillation circuit that oscillates the piezoelectric resonator and controls an oscillation frequency of the piezoelectric resonator based on an oscillation control voltage; and a power source control unit that controls so as to supply a power source voltage to the temperature compensation circuit or so as not to supply the power source voltage to at least a part of the temperature compensation circuit based on a control signal transmitted from the outside, wherein the temperature compensation voltage is supplied as the oscillation control voltage to the voltage-controlled oscillation circuit in synchronization with a period during which the power source voltage is supplied to the temperature compensation circuit.

9 Claims, 8 Drawing Sheets

PIEZOELECTRIC OSCILLATOR, GPS RECEIVER DEVICE, AND ELECTRONIC APPARATUS

BACKGROUND

1. Technical Field

The present invention relates to a piezoelectric oscillator, a GPS receiver device, and an electronic apparatus.

2. Related Art

As a positioning system using satellites, a GPS (Global Positioning System) is widely known and is used in car navigation devices and the like. The GPS receives electric wave signals in the 1.5 GHz band, which are transmitted from a plurality of GPS satellites orbiting the Earth, by using a GPS receiver device and performs a process (position calculation process) of calculating the current position based on orbit information and time information that are superimposed in the received electric wave signals and a time correcting process.

The GPS receiver device performs RF signal processing in which GPS electric waves are received and are converted into a signal in the intermediate frequency band and baseband signal processing in which a baseband signal is demodulated from the signal in the intermediate frequency band, and position calculation and the like are performed based on the baseband signal. The baseband signal processing can be performed with a clock signal with frequency accuracy having a frequency error of about ±100 ppm without any problem. However, in order to be precisely locked to a GPS electric wave signal, the RF signal processing needs a clock signal with extremely high frequency accuracy having a frequency error within ±0.5 ppm. Accordingly, a temperature compensated x'tal oscillator (TCXO) from which a clock signal with high frequency accuracy can be acquired is widely used. The temperature-compensated crystal oscillator (TCXO) outputs a clock signal having an almost constant frequency regardless of the temperature by cancelling a deviation (frequency variations) of the oscillation frequency of a quartz crystal resonator from a desired frequency (nominal frequency) within a predetermined temperature range.

JP-A-2003-163542 is an example of related art.

Recently, the GPS receiver device is built in not only an installation-type electronic apparatus such as a car navigation device but also a portable electronic apparatus such as a cellular phone or a wrist watch. Thus, there is a demand for low power consumption of the GPS receiver device. Furthermore, the power consumption of a circuit that performs the RF signal processing or the baseband signal processing is reduced to a large extent in accordance with advances in technology. As a result, the ratio of the power consumption of the temperature-compensated crystal oscillator (TCXO) to the power consumption of the entire GPS receiver device significantly increases. Therefore, it is important to reduce the power consumption of the temperature-compensated crystal oscillator (TCXO) in a GPS receiver device that is built in a portable electronic apparatus.

SUMMARY

An advantage of some aspects of the invention is that it provides a piezoelectric oscillator that can realize either reduction of the power consumption or improvement of the frequency accuracy based on an external control signal. In addition, another advantage of some aspects of the invention is that it provides a GPS receiver device and an electronic apparatus realizing low power consumption using the piezoelectric oscillator.

(1) According to an aspect of the invention, there is provided a piezoelectric oscillator including: a piezoelectric resonator; a storage unit that stores temperature compensation data used for specifying frequency-temperature characteristics of the piezoelectric resonator therein; a temperature compensation circuit that acquires temperature information and generates a temperature compensation voltage used for compensating the frequency-temperature characteristics of the piezoelectric resonator based on the acquired temperature information and the temperature compensation data; a voltage-controlled oscillation circuit that oscillates the piezoelectric resonator and controls an oscillation frequency of the piezoelectric resonator based on an oscillation control voltage; and a power source control unit that controls so as to supply a power source voltage to the temperature compensation circuit or so as not to supply the power source voltage to at least a part of the temperature compensation circuit based on a control signal transmitted from the outside. The temperature compensation voltage is supplied as the oscillation control voltage to the voltage-controlled oscillation circuit in synchronization with a period during which the power source voltage is supplied to the temperature compensation circuit.

According to the above-described piezoelectric oscillator, when the power source voltage is not supplied to at least a part of the temperature compensation circuit based on a control signal transmitted from the outside, the power consumption can be reduced as that much.

On the other hand, when the power source voltage is supplied to the temperature compensation circuit based on a control signal transmitted from the outside, the piezoelectric oscillator operates as a temperature compensation-type oscillator. Accordingly, the frequency accuracy can be improved.

Therefore, a piezoelectric oscillator can be provided which can realize either reduction of the power consumption or improvement of the frequency accuracy based on a control signal transmitted from the outside.

(2) This piezoelectric oscillator may further includes a temperature compensation voltage control unit that controls so as to supply the temperature compensation voltage or a fixed voltage as the oscillation control voltage to the voltage-controlled oscillation circuit based on the control signal, wherein the temperature compensation voltage control unit supplies the fixed voltage as the oscillation control voltage to the voltage-controlled oscillation circuit when the power source voltage is not supplied to at least a part of the temperature compensation circuit.

In such a case, when the power source voltage is not supplied to at least a part of the temperature compensation circuit, by fixing the oscillation control voltage of the voltage-controlled oscillation circuit, the variation width of the oscillation frequency of the piezoelectric oscillator can be suppressed in the variation width of the temperature.

(3) In the piezoelectric oscillator, the temperature compensation voltage control unit may maintain the temperature compensation voltage simultaneously at or before a time when the power source voltage is not supplied to at least a part of the temperature compensation circuit and supply the temperature compensation voltage maintained as the fixed voltage to the voltage-controlled oscillation circuit when the power source voltage is not supplied to at least the part of the temperature compensation circuit.

In such a case, even after the power source voltage is not supplied to at least a part of the temperature compensation circuit, the temperature compensation voltage immediately before that is fixedly supplied to the voltage-controlled oscillation circuit. Accordingly, the oscillation frequency does not change between before and after stopping the supply of the power source voltage to the temperature compensation circuit.

(4) In the piezoelectric oscillator, the temperature compensation voltage control unit may supply a predetermined constant voltage as the fixed voltage to the voltage-controlled oscillation circuit when the power source voltage is not supplied to at least a part of the temperature compensation circuit.

In such a case, by adding a circuit (for example, a resistor-voltage-divider circuit) having a simple configuration that generates a predetermined constant voltage, the variation width of the oscillation frequency of the piezoelectric oscillator at the time of stopping the supply of the power source voltage to the temperature compensation circuit can be suppressed in the variation width of the temperature while suppressing an increase in the cost.

(5) In the piezoelectric oscillator, the temperature compensation circuit may include: a plurality of voltage generating circuits that generates voltages used for compensating terms of each order number of a polynomial expression that approximates the frequency-temperature characteristics of the piezoelectric resonator based on the temperature information and the temperature compensation data; and a temperature compensation voltage generating circuit that generates the temperature compensation voltage based on the voltages generated by the plurality of voltage generating circuits. In the case, the power source control unit controls whether to supply the power source voltage to the voltage generating circuits that generate the voltages used for compensating the first-order or higher terms of the polynomial expression based on the control signal. In the case, and the temperature-compensated voltage generating circuit supplies a voltage used for compensating the 0-th order term of the polynomial expression as the oscillation control voltage to the voltage-controlled oscillation circuit when the power source voltage is not supplied to the voltage generating circuits that generate the voltages used for compensating the first order and higher terms of the polynomial expression.

In such a case, a circuit (for example, a resistor-voltage-divider circuit) that generates a predetermined constant voltage as the oscillation control voltage of the voltage-controlled oscillation circuit does not need to be newly added, and the variation width of the oscillation frequency of the piezoelectric oscillator at the time of stopping the supply of the power source voltage to the temperature compensation circuit can be suppressed in the variation width of the temperature change while suppressing an increase in the cost.

(6) The piezoelectric oscillator may further include: a delay control unit that controls a delay time until the temperature compensation voltage is supplied to the voltage-controlled oscillation circuit after a state in which the power source voltage is not supplied to at least a part of the temperature compensation circuit changes to a state in which the power source voltage is supplied to the temperature compensation circuit.

In such a case, the temperature compensation voltage is not supplied to the voltage-controlled oscillation circuit during a period during which the power source voltage is supplied to the temperature compensation circuit, and the temperature compensation circuit stably operates. Accordingly, the fluctuation of the oscillation frequency of the piezoelectric oscillator during this period can be controlled.

(7) According to another aspect of the invention, there is provided a GPS receiver device including: any of the above-described piezoelectric oscillator; a reception unit that receives electric wave signals from GPS satellites; an RF processing unit that demodulates a signal in an intermediate frequency band from the electric wave signal based on an oscillation signal of the piezoelectric oscillator; and a baseband processing unit that demodulates a baseband signal from the signal in the intermediate frequency band based on the oscillation signal of the piezoelectric oscillator and performs a predetermined calculation process by extracting predetermined information from the baseband signal. The baseband processing unit generates a control signal used for controlling so as to supply the power source voltage to the temperature compensation circuit of the piezoelectric oscillator during a period during which the RF processing unit demodulates the signal in the intermediate frequency band from the electric wave signal and controlling so as not to supply the power source voltage to at least a part of the temperature compensation circuit of the piezoelectric oscillator in synchronization with a period during which the calculation process is performed and supplies the control signal to the piezoelectric oscillator.

According to the above-described GPS receiver device, the piezoelectric oscillator operates as a temperature compensation-type piezoelectric oscillator during a period during which the RF processing unit demodulates a signal in the intermediate frequency band from an electric wave signal, and accordingly, a clock signal having extremely high frequency accuracy can be supplied to the RF processing unit. On the other hand, during a period during which the baseband processing unit performs a predetermined calculation process, a clock signal having such high frequency accuracy is not required. Thus, by stopping the operation of the temperature compensation circuit, the power consumption of the piezoelectric oscillator can be reduced as that much. Therefore, according to this aspect, a GPS receiver device that implements low power consumption can be realized.

(8) In the GPS receiver device, the baseband processing unit may generate the control signal used for controlling so as to supply the power source voltage to the temperature compensation circuit a predetermined time before time when the RF processing unit starts to perform a process of demodulating the signal in the intermediate frequency band from the electric wave signal.

In such a case, for example, the temperature compensation voltage may not be supplied to the voltage-controlled oscillation circuit of the piezoelectric oscillator until heat generated from the temperature compensation circuit is transferred to the piezoelectric resonator, and a temperature difference between the temperature compensation circuit and the piezoelectric resonator disappears after the power source voltage is supplied to the temperature compensation circuit of the piezoelectric oscillator. Therefore, according to this GPS receiver device, the effects of the frequency error of the piezoelectric oscillator due to the temperature difference are suppressed, thereby the process immediately after the start of the operation of the RF processing unit is not useless.

(9) According to still another aspect of the invention, there is provided an electronic apparatus that includes any of the above-described GPS receiver device.

According to this aspect, low power consumption of an electronic apparatus that includes a GPS receiver device can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. The embodiments described below are not for purposes of limiting the scope of the invention as defined by the claims. In addition, not all the configurations described below are set as essential prerequisites of the invention.

1. Piezoelectric Oscillator 1-1. First Embodiment

Figure 1:
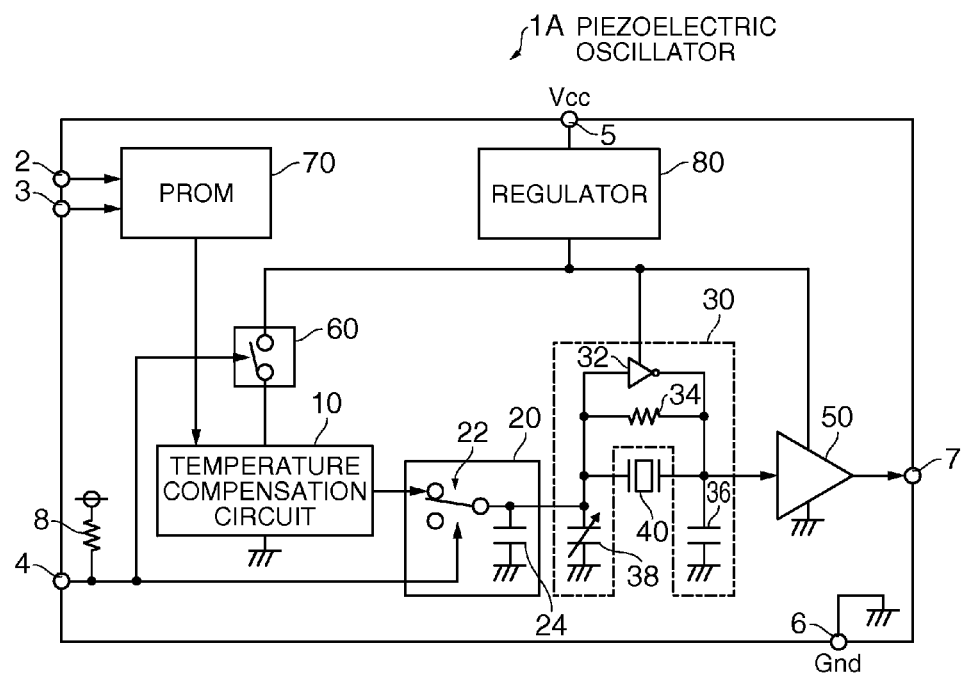
FIG. 1 is a diagram showing an example of the configuration of a piezoelectric oscillator according to a first embodiment.

FIG. 1 is a diagram showing an example of the configuration of a piezoelectric oscillator according to a first embodiment. As shown in FIG. 1, the piezoelectric oscillator 1A according to the first embodiment is configured to include a temperature compensation circuit 10, a sample hold circuit 20, a voltage-controlled oscillation circuit 30, a piezoelectric resonator 40, an output buffer 50, a switch circuit 60, a programmable ROM (PROM) 70, a regulator 80, and the like. A piezoelectric oscillator according to this embodiment may have a configuration in which some of the above-described constituent elements are omitted.

The piezoelectric resonator 40 is a piezoelectric device that vibrates using an inverse piezoelectric effect and is, for example, a resonator using a single crystal material such as a quartz crystal resonator, a ceramic resonator, a lithium niobate resonator, or a lithium tantalate resonator or a resonator using a piezoelectric thin film such as a zinc oxide piezoelectric thin-film resonator or an aluminum oxide thin-film resonator, or the like.

Particularly, it is known that the frequency-temperature characteristics ($\Delta f/f$: here, f is a nominal frequency, and $\Delta f$ is a frequency error) of an AT-cut quartz crystal resonator represent excellent characteristics represented as an approximate cubic curve over a wide temperature range. Thus, by using the AT-cut quartz crystal resonator as the piezoelectric resonator 40, a temperature-compensated quartz crystal oscillator having extremely high-frequency accuracy can be realized.

Accordingly, a temperature-compensated quartz crystal oscillator using the AT-cut quartz crystal resonator as the piezoelectric resonator 40 is widely used in electronic apparatuses that need a high-accuracy clock.

In addition, in a specific process such as a process of receiving electric waves of a GPS, a clock signal having very high frequency accuracy, with which there is a frequency error of about ±0.5 ppm, is required. Thus, in a GPS receiver device, a temperature-compensated crystal oscillator may be used which performs very accurate temperature compensation by increasing the accuracy of approximation, for example, by approximating the frequency-temperature characteristics ($\Delta f/f$) thereof to a quintic function represented in the following Equation (1) by using an AT-cut quartz crystal resonator as the piezoelectric resonator 40. In Equation (1), f represents the nominal frequency, $\Delta f$ represents the frequency error, T represents a temperature variable, and $t_0$ represents the reference temperature (for example, 25° C.)

$$\frac{\Delta f}{f} = A_5(T-t_0)^5 + A_4(T-t_0)^4 + A_3(T-t_0)^3 + A_1(T-t_0) + A_0 \quad (1)$$

The voltage-controlled oscillation circuit 30 allows the piezoelectric resonator 40 to oscillate at a frequency according to an oscillation control voltage by changing the load capacitance of the piezoelectric resonator 40 in accordance with the oscillation control voltage, thereby generating an oscillation signal. In this embodiment, the voltage-controlled oscillation circuit 30 includes an inverter 32, a resistor 34, a capacitor 36, and a varicap 38. By using these elements, an oscillation loop that allows the piezoelectric resonator 40 to oscillate is formed. When the oscillation control voltage is applied to one end of the varicap 38, the capacitance of the varicap 38 changes in accordance with the level of the oscillation control voltage, and the oscillation frequency of the piezoelectric resonator 40 changes in accordance with the capacitance. For example, since the capacitance of the varicap 38 decreases (or increases) as the oscillation control voltage is increased, the oscillation frequency of the piezoelectric resonator 40 can be adjusted by adjusting the oscillation control voltage. Accordingly, by adjusting the oscillation control voltage based on the current temperature in accordance with the frequency-temperature characteristics of the piezoelectric resonator 40 in real time, the oscillation frequency of the piezoelectric resonator 40 can be made almost constant regardless of the temperature.

The output buffer 50 amplifies an oscillation signal of the voltage-controlled oscillation circuit 30 to a desired level that is required at a later stage and outputs the amplified oscillation signal to the outside through an external terminal 7.

The PROM 70 stores temperature compensation data used for specifying the frequency-temperature characteristics of the piezoelectric resonator 40 therein and serves as a storage unit according to an embodiment of the invention. To be more specific, the temperature compensation data is a parameter that is used for specifying a curve representing the frequency-temperature characteristics of the piezoelectric resonator 40. For example, the frequency-temperature characteristics represented in Equation (1) can be specified by a fifth-order coefficient $A_5$, a fourth-order coefficient $A_4$, a third-order coefficient $A_3$, a first-order coefficient $A_1$, and a constant $A_0$ when the reference temperature $t_0$ is fixed. Thus, according to this embodiment, the fifth-order coefficient data ($A_5$), the fourth-order coefficient data ($A_4$), the third-order coefficient data ($A_3$), the first-order coefficient data ($A_1$), and the constant data (0-th order coefficient data) ($A_0$) are stored in the PROM 70 as the temperature compensation data.

By supplying a clock signal and a data signal to the external terminals 2 and 3 of the PROM 70, data can be written into a memory element through a two-line type interface (an I²C interface or the like). By adding an external terminal through which an enable signal is supplied, a three-line type interface may be formed. In a test process for a piezoelectric oscillator 1A or the like, the frequency-temperature characteristics of the piezoelectric resonator 40 are measured, temperature compensation data is generated based on the measured data, and the temperature compensation data is written into the PROM 70 through the external terminals 2 and 3. Based on the temperature compensation data, individual variances in the frequency-temperature characteristics of the piezoelectric resonator 40 can be absorbed.

The PROM 70 can be implemented by an OTPROM (One Time Programmable ROM) of an EEPROM (Electrically Erasable Programmable ROM) type or a fuse type.

In addition, the PROM 70 may store therein adjustment data, which is used for adjusting the capacity of the inverter 32 in accordance with the characteristics of the piezoelectric resonator 40, or the like together with the temperature compensation data.

Figure 2:
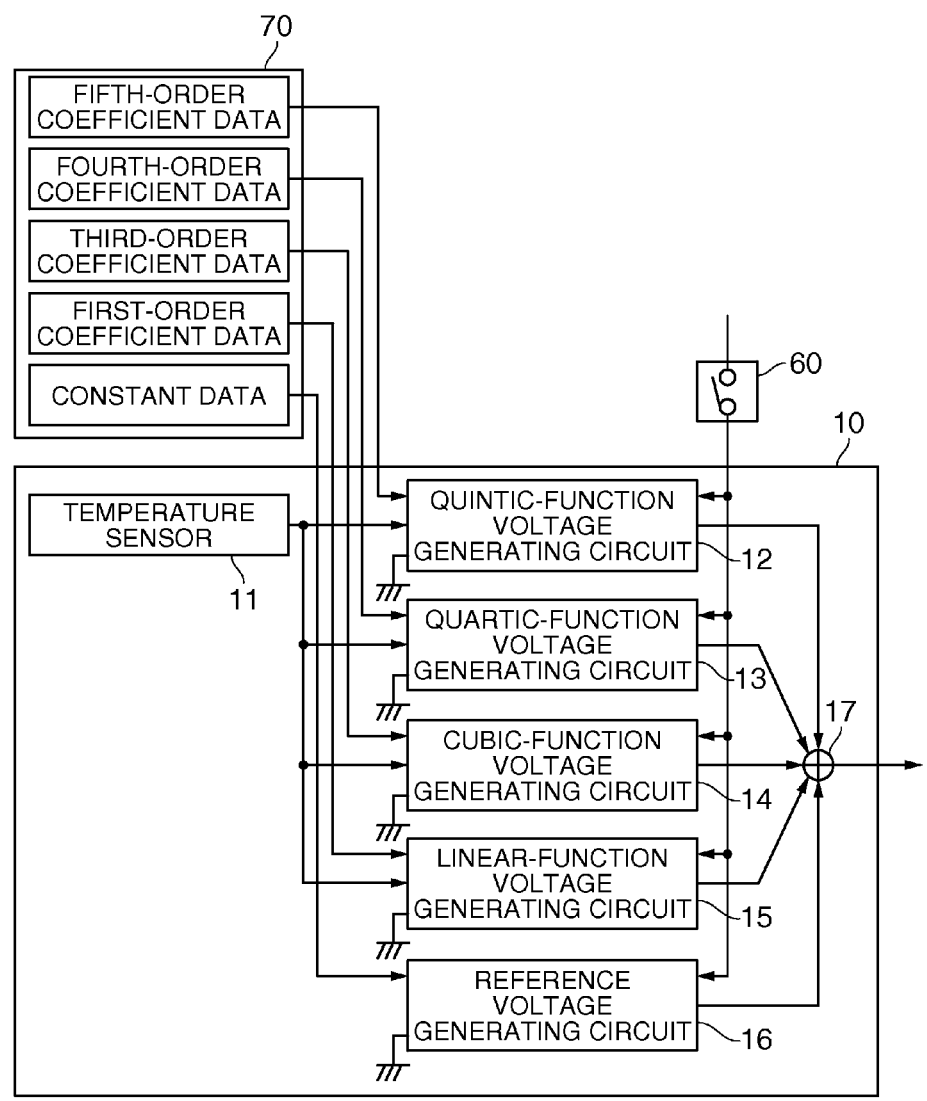
FIG. 2 is a diagram showing an example of the configuration of a temperature compensated circuit.

The temperature compensation circuit 10 acquires temperature information and generates a temperature compensation voltage, which is used for compensating the frequency-temperature characteristics of the piezoelectric resonator 40 based on the acquired temperature information and the temperature compensation data stored in the temperature compensation data stored in the PROM 70. FIG. 2 is a diagram showing an example of the configuration of the temperature compensation circuit 10. As shown in FIG. 2, the temperature compensation circuit 10 according to this embodiment is configured to include a temperature sensor 11, a quintic-function voltage generating circuit 12, a quartic-function voltage generating circuit 13, a cubic-function voltage generating circuit 14, a linear-function voltage generating circuit 15, a reference voltage generating circuit 16, and a voltage adder circuit 17.

The temperature sensor 11 is a sensor that outputs a voltage according to temperature and, for example, can be implemented by a thermistor that acquires a temperature change as a change in electrical resistance.

The quintic-function voltage generating circuit 12 generates a voltage (a quintic-function voltage) that compensates $A_5(T-t_0)^5$ that is a fifth-order term of Equation (1) based on the fifth-order coefficient data $A_5$ stored in the PROM 70 and the output voltage of the temperature sensor 11.

The quartic-function voltage generating circuit 13 generates a voltage (a quartic-function voltage) that compensates $A_4(T-t_0)^4$ that is a fourth-order term of Equation (1) based on the fourth-order coefficient data $A_4$ stored in the PROM 70 and the output voltage of the temperature sensor 11.

The cubic-function voltage generating circuit 14 generates a voltage (a cubic-function voltage) that compensates $A_3(T-t_0)^3$ that is a third-order term of Equation (1) based on the third-order coefficient data $A_3$ stored in the PROM 70 and the output voltage of the temperature sensor 11.

The linear-function voltage generating circuit 15 generates a voltage (a linear-function voltage) that compensates $A_1(T-t_0)$ that is a first-order term of Equation (1) based on the first-order coefficient data $A_1$ stored in the PROM 70 and the output voltage of the temperature sensor 11.

The reference voltage generating circuit 16 generates a voltage (a reference voltage) that compensates $A_0$ that is a constant term (0-th order term) of Equation (1) based on the constant data (the 0-th order coefficient data) $A_0$ stored in the PROM 70 and the output voltage of the temperature sensor 11. For example, this reference voltage is a voltage at which the oscillation frequency of the piezoelectric resonator 40 at the reference temperature $t_0$ (for example, 25° C.) is the nominal frequency.

The voltage adder circuit 17 generates a temperature compensation voltage by adding the output voltage (the quintic-function voltage) of the quintic-function voltage generating circuit 12, the output voltage (the quartic-function voltage) of the quartic-function voltage generating circuit 13, the output voltage (the cubic-function voltage) of the cubic-function voltage generating circuit 14, the output voltage (the linear-function voltage) of the linear-function voltage generating circuit 15, and the output voltage (the reference voltage) of the reference voltage generating circuit 16.

The regulator 80 sets a power source voltage supplied though an external terminal 5 to a voltage of a predetermined level, stabilizes the power source voltage and supplies the stabilized power source voltage as a power source voltage of the temperature compensation circuit 10, the voltage-controlled oscillation circuit 30, and the output buffer 50. On the other hand, the ground (the electric potential ground) of the temperature compensation circuit 10, the sample hold circuit 20, the voltage-controlled oscillation circuit 30, the output buffer 50, and the like is supplied through the external terminal 6.

According to this embodiment, the power source voltage output from the regulator 80 is constantly supplied to the voltage-controlled oscillation circuit 30 and the output buffer 50. On the other hand, in the temperature compensation circuit 10, the supply of the power source voltage output from the regulator 80 is controlled depending on the opening or closing of the switch circuit 60. In other words, the switch circuit 60 controls whether or not the power source voltage is supplied to the temperature compensation circuit 10 based on a control signal input through an external terminal 4 and serves as a power source control unit according to an embodiment of the invention. According to this embodiment, the external terminal 4 is pulled up at the power source electric potential through a pull-up resistor 8, and when the external terminal 4 is in the high level or is opened, the switch circuit 60 is closed, and accordingly, the power source voltage is supplied to the temperature compensation circuit 10. On the other hand, when the external terminal 4 is in the low level, the switch circuit 60 is opened, and accordingly, the power source voltage is not supplied to the temperature compensation circuit 10.

The sample hold circuit 20 allows the power source voltage not to be supplied to the temperature compensation circuit 10 based on a control signal transmitted through the external terminal 4 and maintains the output voltage (the temperature compensation voltage) of the temperature compensation circuit 10 simultaneously with or before the non-supplying of the power source voltage. On the other hand, when the power source voltage is not supplied to the temperature compensation circuit 10, the sample hold circuit 20 supplies the maintained temperature compensation voltage to the voltage-controlled oscillation circuit 30. In this embodiment, the sample hold circuit 20 is configured to include a three-port switch circuit 22 and a capacitor 24 of which one end is grounded. The switch circuit 22 controls whether the other end of the capacitor 24 is connected to the output of the temperature compensation circuit 10 or is opened based on the voltage level of the external terminal 4, and a voltage applied between the capacitor 24 is supplied to the voltage-controlled oscillation circuit 30 as the oscillation control voltage.

According to this embodiment, the switch circuit 22 connects the temperature compensation circuit 10 and the capacitor 24 when the external terminal 4 is in a high level or is opened. On the other hand, the switch circuit 22 allows the capacitor 24 to be opened when the external terminal 4 is in a low level. Accordingly, when the external terminal 4 is in the high level or is opened, the output voltage (temperature compensation voltage) of the temperature compensation circuit becomes the oscillation control voltage of the voltage-controlled oscillation circuit 30. On the other hand, when the state of the external terminal 4 changes from the high level or the open state to a low level, the temperature compensation voltage immediately before the change is maintained in the capacitor 24. Accordingly, when the external terminal 4 is in the low level, the maintained temperature compensation voltage becomes the oscillation control voltage of the voltage-controlled oscillation circuit 30.

As above, the sample hold circuit 20 controls whether to supply the temperature compensation voltage or a fixed voltage (the voltage maintained at the capacitor 24) to the voltage-controlled oscillation circuit 30 based on the control signal transmitted through the external terminal 4 and serves as a temperature-controlled voltage control unit according to an embodiment of the invention.

When the external terminal 4 is in the high level or is opened, the piezoelectric oscillator 1A according to the first embodiment having the above-described configuration supplies the power source voltage to the temperature compensation circuit 10 and serves as a temperature-controlled piezoelectric oscillator, thereby enabling the output of an oscillation signal having high frequency accuracy. On the other hand, when the external terminal 4 is in the low level, the piezoelectric oscillator 1A stops supplying the power source voltage to the temperature compensation circuit 10 and operates as a simple piezoelectric oscillator of which the oscillation frequency is controlled in accordance with the fixed voltage that is maintained in the capacitor 24, thereby enabling the reduction of the power consumption corresponding to the temperature compensation circuit. In other words, according to this embodiment, a piezoelectric oscillator can be provided which can realize either reduction of the power consumption or improvement of the frequency accuracy based on an external control signal.

For example, in a case where, of the total power consumption of the piezoelectric oscillator, the power consumption of the temperature compensation circuit 10 occupies about 50%, the power consumption of the voltage-controlled oscillation circuit 30 and the piezoelectric resonator 40 occupies about 20%, and the power consumption of the output buffer occupies about 30%, about 50% of the power consumption can be reduced during a period during which the supply of the power source voltage to the temperature compensation circuit 10 is stopped. In addition, when the period during which the supply of the power source voltage to the temperature compensation circuit 10 is 90% of a total period, about 45% (=50%×90%) of the power consumption can be reduced as a whole.

In addition, according to the piezoelectric oscillator 1A of the first embodiment, even after the power source voltage is not supplied to the temperature compensation circuit 10, the temperature compensation voltage supplied immediately before is fixedly supplied to the voltage-controlled oscillation circuit 30. Accordingly, the oscillation frequency before and after the stopping of the supply of the power source voltage to the temperature compensation circuit 10 does not change.

1-2 Second Embodiment

Figure 3:
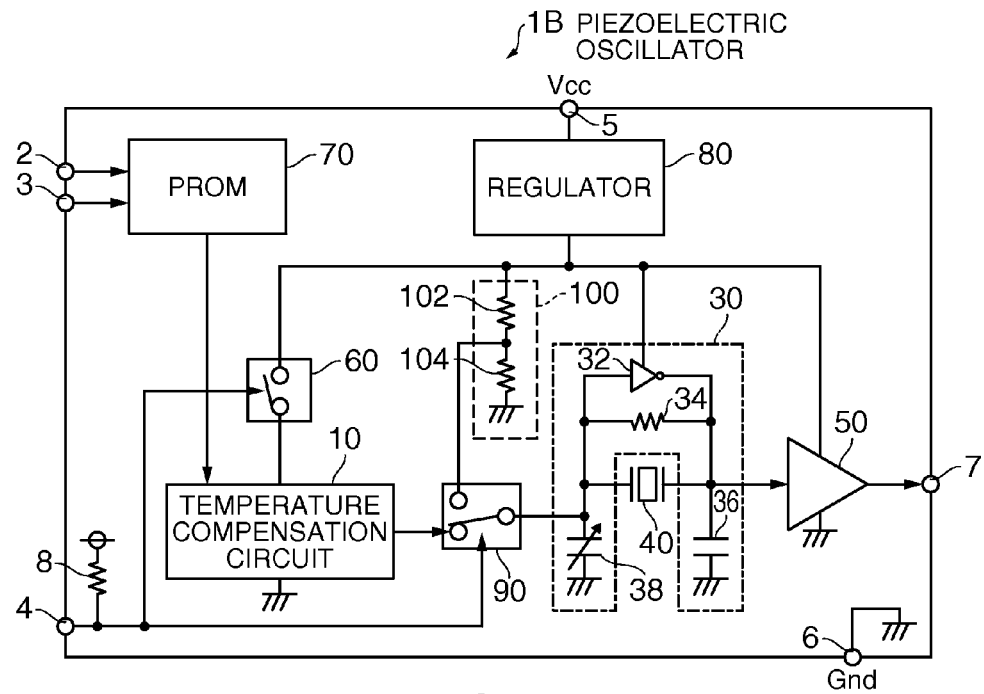
FIG. 3 is a diagram showing an example of the configuration of a piezoelectric oscillator according to a second embodiment.

FIG. 3 is a diagram showing an example of the configuration of a piezoelectric oscillator according to a second embodiment. As shown in FIG. 3, the piezoelectric oscillator 1B according to the second embodiment is configured to include a temperature compensation circuit 10, a voltage-controlled oscillation circuit 30, a piezoelectric resonator 40, an output buffer 50, a switch circuit 60, a PROM 70, a regulator 80, a switch circuit 90, and a constant-voltage generating circuit 100, and the like. A piezoelectric oscillator according to this embodiment may have a configuration in which some of the above-described constituent elements are omitted.

According to the piezoelectric oscillator 1B of the second embodiment, the sample hold circuit 20 is replaced with the switch circuit 90 and the constant-voltage generating circuit 100 in the piezoelectric oscillator 1A of the first embodiment.

The constant-voltage generating circuit 100 generates a constant voltage that is acquired by dividing the power source voltage output from the regulator 80 using resistors in accordance with the ratio of resistance values of a resistor 102 and a resistor 104. This constant voltage, for example, may be a reference voltage that compensates the constant term $A_0$ of Equation (1), that is, a voltage for which the oscillation frequency of the piezoelectric resonator 40 at reference temperature $t_0$ (for example, 25° C.) is the nominal frequency or a constant voltage near the reference voltage.

The switch circuit 90 selects either the output voltage (the temperature compensation voltage) of the temperature compensation circuit 10 or the constant voltage generated by the constant-voltage generating circuit 100 in accordance with the voltage level of the external terminal 4 and supplies the selected voltage to the voltage-controlled oscillation circuit 30 as an oscillation control voltage. According to this embodiment, the switch circuit 90 selects the temperature compensation voltage when the external terminal 4 is in the high level or is open (when the switch circuit 60 is closed), and selects the constant voltage when the external terminal 4 is in the low level (when the switch circuit 60 is opened). In other words, the switch circuit 90 selects the temperature compensation voltage when the power source voltage is supplied to the temperature compensation circuit 10 or selects the constant voltage when the power source voltage is not supplied to the temperature compensation circuit 10, and supplies the selected voltage to the voltage-controlled oscillation circuit 30 as the oscillation control voltage.

As above, the switch circuit 90 controls whether to supply the temperature compensation voltage or a fixed voltage (the constant voltage generated by the constant-voltage generating circuit 100) to the voltage-controlled oscillation circuit 30 based on the control signal transmitted through the external terminal 4 and serves as a temperature compensated voltage control unit according to an embodiment of the invention.

Since the other configurations shown in FIG. 3 are the same as those shown in FIG. 1, the same reference numerals are assigned thereto, and the description thereof is omitted.

When the external terminal 4 is in the high level or is opened, the piezoelectric oscillator 1B according to the second embodiment having the above-described configuration supplies the power source voltage to the temperature compensation circuit 10 and serves as a temperature-controlled piezoelectric oscillator, thereby enabling the output of an oscillation signal having high frequency accuracy. On the other hand, when the external terminal 4 is in the low level, the piezoelectric oscillator 1B stops supplying the power source voltage to the temperature compensation circuit 10 and operates as a simple piezoelectric oscillator (a piezoelectric oscillator having frequency variations according to the frequency-temperature characteristics of the piezoelectric resonator 40) of which the oscillation frequency is controlled in accordance with the constant voltage that is generated by the constant-voltage generating circuit 100, thereby enabling the reduction of the power consumption corresponding to the temperature compensation circuit. In other words, according to this embodiment, a piezoelectric oscillator can be provided which can realize either reduction of the power consumption or improvement of the frequency accuracy based on an external control signal.

In addition, according to the piezoelectric oscillator 1B of the second embodiment, by adding the constant-voltage generating circuit (a resistor-voltage-divider circuit) having a simple configuration, the variation width of the oscillation frequency at the time of stopping supplying the power source voltage to the temperature compensation circuit 10 can be suppressed to a temperature variation width (for example, in a case where the piezoelectric resonator 40 is a quartz crystal resonator, within ±100 ppm), while suppressing a cost increase.

1-3 Third Embodiment

Figure 4:
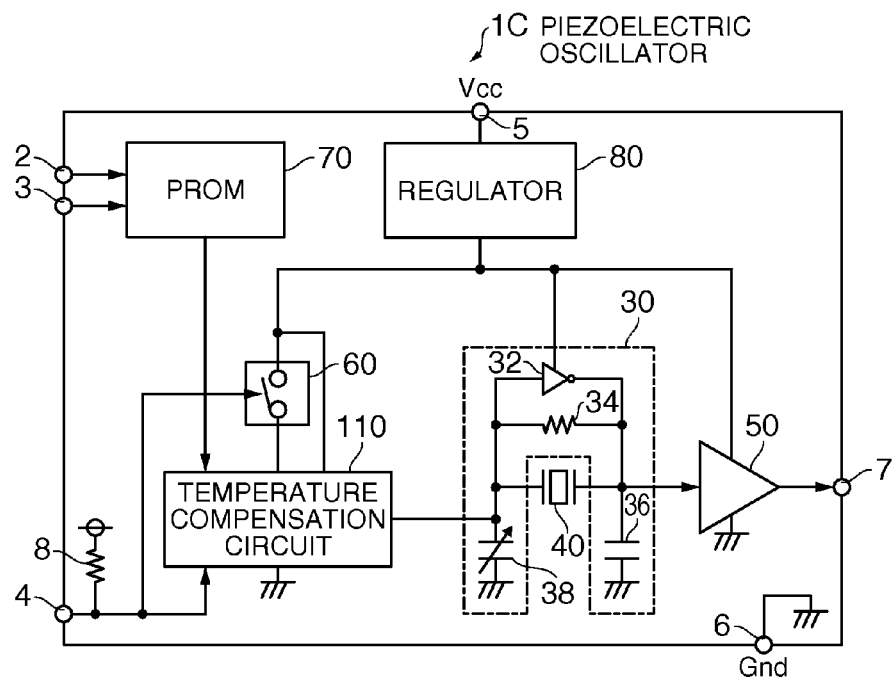
FIG. 4 is a diagram showing an example of the configuration of a piezoelectric oscillator according to a third embodiment.

FIG. 4 is a diagram showing an example of the configuration of a piezoelectric oscillator according to a third embodiment. As shown in FIG. 4, the piezoelectric oscillator 1C according to the third embodiment is configured to include a temperature compensation circuit 110, a voltage-controlled oscillation circuit 30, a piezoelectric resonator 40, an output buffer 50, a switch circuit 60, a PROM 70, a regulator 80, and the like. A piezoelectric oscillator according to this embodiment may have a configuration in which some of the above-described constituent elements are omitted.

According to the piezoelectric oscillator 1C of the third embodiment, the sample hold circuit 20 is omitted from the piezoelectric oscillator 1A according to the first embodiment, and the configuration of the temperature compensation circuit 110 is different from that of the temperature compensation circuit 10.

Figure 5:
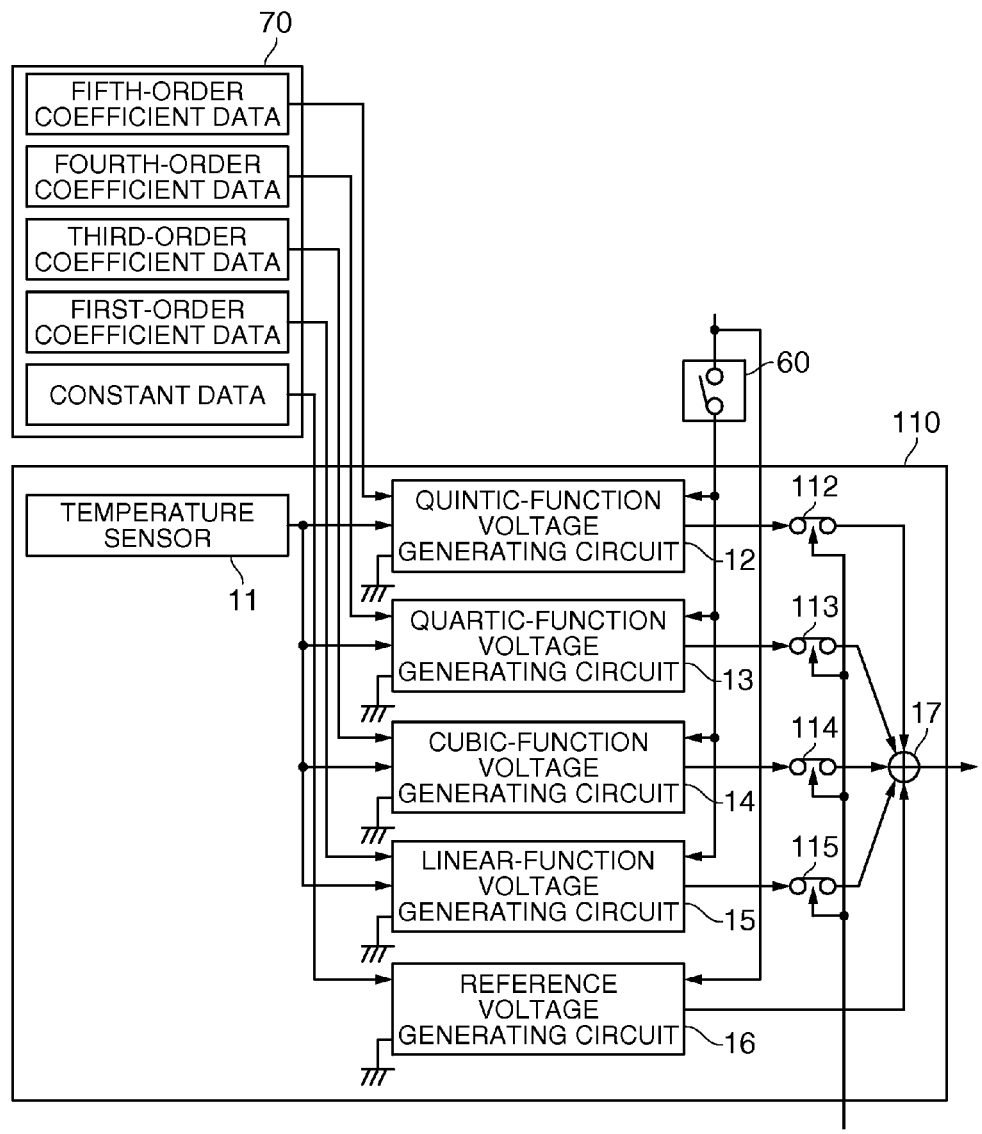
FIG. 5 is a diagram showing an example of the configuration of a temperature compensated circuit.

FIG. 5 is a diagram showing an example of the configuration of the temperature compensation circuit 110. As shown in FIG. 5, according to the temperature compensation circuit 110 of this embodiment, switch circuits 112, 113, 114, and 115 are added between the quintic-function voltage generating circuit 12, the quartic-function voltage generating circuit 13, the cubic-function voltage generating circuit 14, and the linear-function voltage generating circuit and the voltage adder circuit 17 in the temperature compensation circuit 10 according to the first embodiment.

When the external terminal 4 is in the high level or is opened (when the switch circuit 60 is closed), all the switch circuits 112, 113, 114, and 115 are closed, and accordingly, the temperature compensation circuit 110 adds the quintic-function voltage, the quartic-function voltage, the cubic-function voltage, the linear-function voltage, and the reference voltage by using the voltage adder circuit 17 and outputs a resultant voltage as the temperature compensation voltage. At this time, since the switch circuit 60 is closed, the power source voltage is supplied to the quintic-function voltage generating circuit 12, the quartic-function voltage generating circuit 13, the cubic-function voltage generating circuit 14, and the linear-function voltage generating circuit 15. On the other hand, when the external terminal 4 is in the low level (when the switch circuit 60 is opened), all the switch circuits 112, 113, 114, and 115 are opened, and the temperature compensation circuit 110 outputs the reference voltage that compensates the constant term $A_0$ of Equation (1). At this time, since the switch circuit 60 is opened, the power source voltage is not supplied to the quintic-function voltage generating circuit 12, the quartic-function voltage generating circuit 13, the cubic-function voltage generating circuit 14, and the linear-function voltage generating circuit 15. In addition, the power source voltage is constantly supplied to the reference voltage generating circuit 16 regardless of the opening or closing of the switch circuit 60.

As above, the switch circuits 112, 113, 114, and 115, and the voltage adder circuit 17 supply the reference voltage that is used for compensating the constant term (the 0-th order term) of Equation (1) to the voltage-controlled oscillation circuit 30 when the power source voltage is not supplied to the voltage generating circuits 12, 13, 14, and 15 that generate voltages used for compensating the first-order and higher terms of Equation (1) and serve as a temperature compensation voltage generating circuit according to an embodiment of the invention.

Since the other configurations shown in FIG. 4 are the same as those shown in FIG. 1, the same reference numerals are assigned thereto, and the description thereof is omitted.

When the external terminal 4 is in the high level or is opened, the piezoelectric oscillator 1C according to the third embodiment having the above-described configuration supplies the power source voltage to the quintic-function voltage generating circuit 12, the quartic-function voltage generating circuit 13, the cubic-function voltage generating circuit 14, and the linear-function voltage generating circuit 15 inside the temperature compensation circuit 10 and serves as a temperature-compensated piezoelectric oscillator, thereby enabling the output of an oscillation signal having high frequency accuracy. On the other hand, when the external terminal 4 is in the low level, the piezoelectric oscillator 1C stops supplying the power source voltage to the quintic-function voltage generating circuit 12, the quartic-function voltage generating circuit 13, the cubic-function voltage generating circuit 14, and the linear-function voltage generating circuit 15 inside the temperature compensation circuit 10 and operates as a simple piezoelectric oscillator (a piezoelectric oscillator having frequency variations according to the frequency-temperature characteristics of the piezoelectric resonator 40) of which the oscillation frequency is controlled in accordance with the constant voltage that is generated by the reference voltage generating circuit 16, thereby enabling the reduction of the power consumption corresponding to the quintic-function voltage generating circuit 12, the quartic-function voltage generating circuit 13, the cubic-function voltage generating circuit 14, and the linear-function voltage generating circuit 15. In other words, according to this embodiment, a piezoelectric oscillator can be provided which can realize either reduction of the power consumption or improvement of the frequency accuracy based on an external control signal.

In addition, according to the piezoelectric oscillator 1C of the third embodiment, a constant-voltage generating circuit (a resistor-voltage-divider circuit) does not need to be newly added, and the variation width of the oscillation frequency at the time of stopping supplying the power source voltage to the temperature compensation circuit 10 can be suppressed to a temperature variation width (for example, in a case where the piezoelectric resonator 40 is a quartz crystal resonator, within ±100 ppm), while suppressing a cost increase.

1-4. Fourth Embodiment

Figure 6:
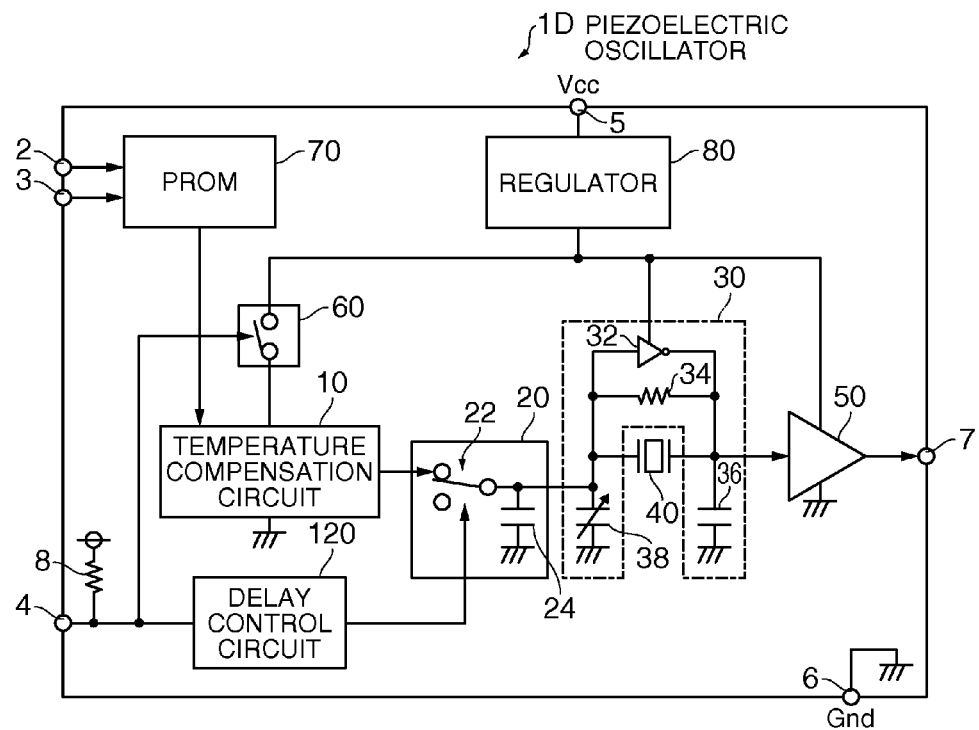
FIG. 6 is a diagram showing an example of the configuration of a piezoelectric oscillator according to a fourth embodiment.

FIG. 6 is a diagram showing an example of the configuration of a piezoelectric oscillator according to a fourth embodiment. As shown in FIG. 6, the piezoelectric oscillator 1D according to the fourth embodiment is configured to include a temperature compensation circuit 10, a sample hold circuit 20, a voltage-controlled oscillation circuit 30, a piezoelectric resonator 40, an output buffer 50, a switch circuit 60, a PROM 70, a regulator 80, a control circuit 120 and the like. A piezoelectric oscillator according to this embodiment may have a configuration in which some of the above-described constituent elements are omitted.

According to the piezoelectric oscillator 1D of the fourth embodiment, the delay control circuit 120 is added to the piezoelectric oscillator 1A according to the first embodiment.

The delay control circuit 120 controls a delay time (it may be fixed or variable) that is a time until the temperature compensation voltage is supplied to the voltage-controlled oscillation circuit 30 after the state, in which the power source voltage is not supplied to the temperature compensation circuit 10, changes to the state, in which the power source voltage is supplied to the temperature compensation circuit 10, and serves as a delay control unit according to an embodiment of the invention. According to this embodiment, the delay control circuit 120 counts a predetermined time from when the state of the external terminal 4 changes from the low level to the high level or the opened state (when the switch circuit 60 is closed) and controls the opening or closing of the switch circuit 22 of the sample hold circuit 20 such that the terminal of the capacitor 24 is opened before the elapse of a predetermined delay time, and the terminal of the capacitor 24 is connected to the output of the temperature compensation circuit 10 after the elapse of the predetermined delay time. On the other hand, the delay control circuit 120 controls the switch circuit 22 so as to immediately open the terminal of the capacitor 24 when the state of the external terminal 4 changes to the low level from the high level or the opened state (when the switch circuit 60 is opened).

Since the other configurations shown in FIG. 6 are the same as those shown in FIG. 1, the same reference numerals are assigned thereto, and the description thereof is omitted.

According to the piezoelectric oscillator 1D of the fourth embodiment having the above-described configuration, by adjusting the delay time in advance, the temperature compensation voltage is not supplied to the voltage-controlled oscillation circuit 30 during the period until the temperature compensation circuit 10 is in a stable operation after the supply of the power source voltage to the temperature compensation circuit 10, and the fluctuation of the oscillation frequency during the period can be suppressed, in addition to the same advantages as those of the piezoelectric oscillator 1A according to the first embodiment.

2. GPS Receiver Device and Electronic Apparatus
2-1. Overview of GPS

Figure 7:
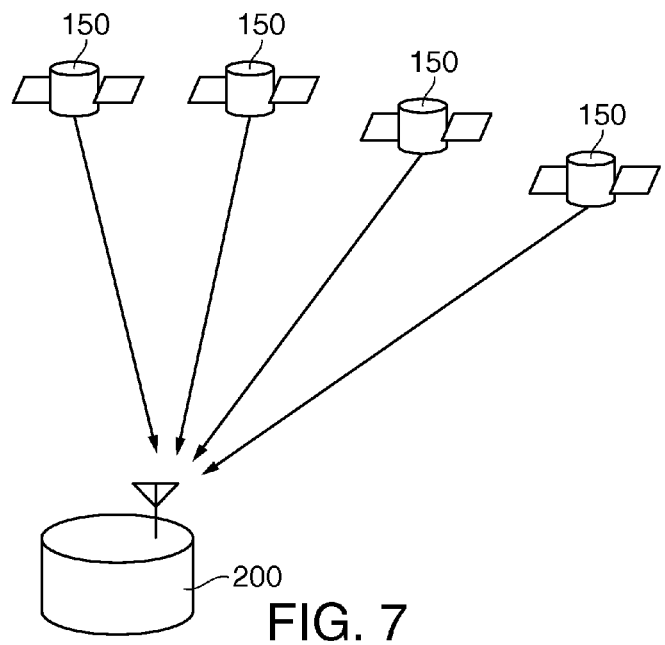
FIG. 7 is a schematic diagram illustrating an overview of a GPS.

FIG. 7 is a schematic diagram illustrating an overview of a GPS.

A GPS satellite 150 revolves in a predetermined orbit in the upper atmosphere of the Earth and transmits a signal (hereinafter, referred to as a "GPS satellite signal") acquired by superimposing a navigation message on a 1.57542 GHz electric wave (L1 wave) toward the ground. The GPS receiver device 200 is a device that receives the GPS satellite signal and demodulates the navigation message.

Currently, there are about 30 GPS satellites, and in order to identify a GPS satellite that has transmitted a specific GPS satellite signal, each GPS satellite superimposes a unique pattern of 1023 chips (a period of 1 ms) called a C/A code (Coarse/Acquisition Code) on the GPS satellite signal. Each chip of the C/A code is either +1 or −1, and the C/A code forms a random pattern. Accordingly, by taking a correlation between the GPS satellite signal and the pattern of each CA code, the C/A code that is superimposed on the GPS satellite signal can be detected.

The GPS satellite 150 has an atomic clock built therein, and extremely accurate clock information that is measured by the atomic clock is included in the GPS satellite signal. In addition, a small amount of time error of the atomic clock that is built in each GPS satellite is measured by a control segment on the ground, and a time correction parameter that is used for correcting the time error is included in the GPS satellite signal as well. Accordingly, the GPS receiver device 200 receives a GPS satellite signal transmitted from one GPS satellite and can correct the internal time so as to the be correct time by using the time information and the time correction parameter that are included in the GPS satellite signal.

In addition, in the GPS satellite signal, orbit information that represents the position of the GPS satellite 150 in the orbit is included. The GPS receiver device 200 can calculate the position by using the time information and the orbit information. In a case where a three dimensional position (x, y, z) of the GPS receiver device 200 is to be specified, the GPS receiver device 200 receives GPS satellite signals transmitted from three or more GPS satellites and calculates the position by using the time information and the orbit information included therein. On a premise that error is included in the internal clock of the GPS receiver device 200 to some degree, the time error is an unknown number in addition to the x, y, and z parameters. Accordingly, there are cases where the GPS receiver device 200 receives GPS satellite signals transmitted from four or more GPS satellites, and the position is calculated by using the time information and the orbit information included therein.

2.2 Configuration of GPS Receiver Device

Figure 8:
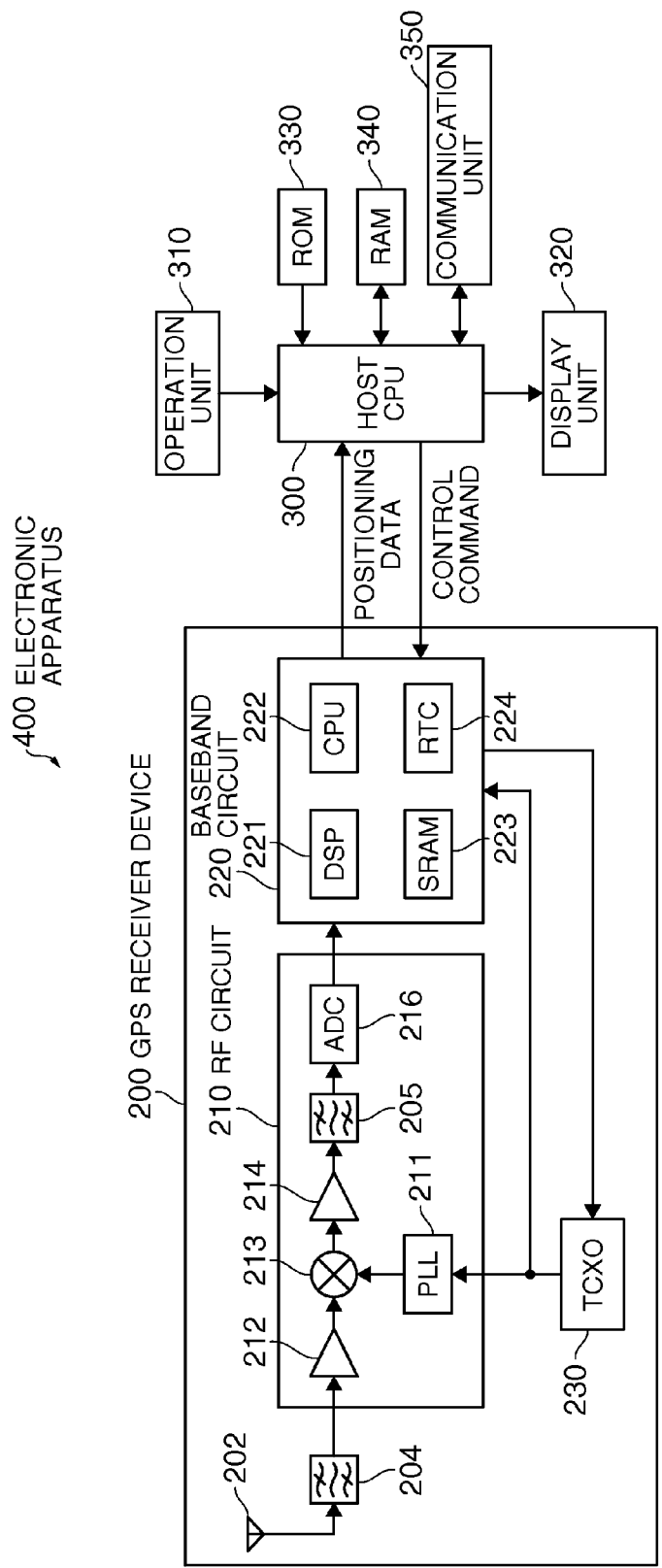
FIG. 8 is a functional block diagram showing an example of the configuration of a GPS receiver device according to this embodiment and an electronic apparatus including the GPS receiver device.

FIG. 8 is a functional block diagram showing an example of the configuration of a GPS receiver device according to this embodiment and an electronic apparatus including the GPS receiver device. The electronic apparatus 400 according to this embodiment is configured to include a GPS receiver device 200, a host CPU 300, an operation unit 310, a display unit 320, a ROM (Read Only Memory) 330, a RAM (Random Access Memory) 340, and a communication unit 350.

The host CPU 300 performs various calculation processes and control processes in accordance with programs stored in the ROM 330. To be more specific, the host CPU 300 controls the operation of the GPS receiver device 200 by transmitting various control commands to the GPS receiver device 200 and performs various calculation processes by receiving positioning data from the GPS receiver device 200. In addition, the host CPU 300 performs various processes according to operation signals transmitted from the operation unit 310, a process of transmitting display signals for displaying various types of information on the display unit 320, a process of controlling the communication unit 350 so as to perform data communication with the outside, and the like.

The operation unit 310 is an input device that is configured by operation keys, button switches, or the like and outputs an operation signal according to the operation of a user to the host CPU 300. In accordance with the operation of the operation unit 310, various instructions such as the start of positioning or the completion of positioning are input.

The display unit 320 is a display device that is configured by an LCD (liquid crystal Display) or the like and displays various types of information (for example, navigation information, time information, or the like) based on a display signal that is input from the host CPU 300.

The ROM 330 stores therein programs used by the host CPU 300 for performing various calculation processes or control processes, various programs for implementing a navigation function and the like, data, and the like.

The RAM 340 is used as a work area of the host CPU 300 and temporarily stores programs and data that are read out from the ROM 330, data input from the operation unit 310, results of calculation performed by the host CPU 300 in accordance with various programs, and the like.

The communication unit 350 performs various control operations used for setting up a data communication between the host CPU 300 and an external device.

The GPS receiver device 200 is configured to include a GPS antenna 202, a SAW (Surface Acoustic Wave) filter 204, an RF circuit 210, a baseband circuit 220, and a temperature-compensated crystal oscillator (TCXO) 230 and performs a process of receiving a GPS satellite signal, a process of acquiring the time information and the orbit information, a process of calculating the position, and the like.

The GPS antenna 202 is an antenna that receives various electric waves including GPS satellite signals. The SAW filter 204 performs a process of extracting a GPS satellite signal from the electric waves received by the GPS antenna 202. In other words, the SAW filter 204 is configured as a band-pass filter that allows a signal in the 1.5 GHz band to pass. The GPS antenna 202 and the SAW filter 204 serve as a reception unit according to an embodiment of the invention.

The RF circuit 210 is configured to include a PLL (phase locked Loop) 211, an LNA (Low Noise Amplifier) 212, a mixer 213, an IF amplifier 214, an IF (Intermediate Frequency) filter 215, an ADC (A/D converter) 216.

The PLL 211 generates a clock signal that is acquired by multiplying an oscillation signal of the TCXO 230 that oscillates at about several tens of MHz so as to have a frequency in the 1.5 GHz band.

The GPS satellite signal extracted by the SAW filter 204 is amplified by the LNA 212. The GPS satellite signal amplified by the LNA 212 is mixed with a clock signal, which is output by the PLL 211, by the mixer 213 and is down-converted into a signal (IF signal) in the intermediate frequency band (for example, several MHz). The signal mixed by the mixer 213 is amplified by the IF amplifier 214.

Since a high-frequency signal of the GHz order is generated together with the IF signal by the mixing process of the mixer 213, the IF amplifier 214 amplifies the high-frequency signal together with the IF signal. The IF filter 215 passes the IF signal and eliminates the high-frequency signal (more precisely, attenuates the high-frequency signal to a predetermined level or lower). The IF signal passing though the IF filter 215 is converted into a digital signal by the ADC (A/D converter) 216.

As above, the RF circuit 210 demodulates the IF signal from the GPS satellite signal based on the oscillation signal of the TCXO 230 and serves as an RF processing unit according to an embodiment of the invention.

The baseband circuit 220 is configured to include a DSP (Digital Signal Processor) 221, a CPU (Central Processing Unit) 222, an SRAM (Static Random Access Memory) 223, and an RTC (Real Time Clock) 224 and performs various processes with the oscillation signal of the TCXO 230 being used as a clock signal.

The DSP 221 and the CPU 222 demodulate the baseband signal from the IF signal in cooperation with each other, acquire the time information and the orbit information that are included in the navigation message by performing various processes for the baseband signal, and calculates the position.

The SRAM 223 is used for storing the time information and the orbit information that have been acquired. The RTC 224 generates timings for performing the baseband process. This RTC 224 is counted up in accordance with a clock signal transmitted from the TCXO 230.

The baseband circuit 220 performs a process of generating a local code having the same pattern as that of each C/A code, for example, in a satellite searching process to be described later and taking a correlation between each C/A code included in the baseband signal and the local code, as a baseband signal process. Then, the baseband circuit 220 adjusts the generation timings of the local codes such that a correlation value of each local code becomes a peak. In a case where the correlation value is equal to or greater than a threshold value, the baseband circuit 220 determines that the local codes are synchronized with the GPS satellite (the GPS satellite is captured). In the GPS, a CDMA (Code Division Multiple Access) method is used in which all the GPS satellites transmit satellite signals having the same frequency by using different C/A codes. Accordingly, by determining the C/A code included in the received GPS satellite signal, a search can be performed for GPS satellites that can be captured can be found.

In addition, in order to acquire the time information and the orbit information of the captured GPS satellite, the baseband circuit 220 performs a process of mixing the local code having the same pattern as that of the C/A code of the GPS satellite and the baseband signal. In the mixed signal, a navigation message that includes the time information and the orbit information of the captured GPS satellite is demodulated. Then, the baseband circuit 220 performs a process of acquiring the orbit information and the time information included in the navigation message and storing the acquired information in the SRAM 223.

In addition, the baseband circuit 220 calculates the position based on the time information and the orbit information and performs a process of transmitting the position information (positioning data) acquired through the position calculation process to the host CPU 300.

In order to be accurately locked to the GPS satellite signal frequency, the RF circuit 210 needs an extremely accurate clock signal having a frequency error within ±0.5 ppm. In contrast, the baseband circuit 220 performs all the processes as digital processes, and accordingly, the baseband circuit 220 can normally operate even with a clock signal having a frequency error of about ±100 ppm (approximately the variation width of the frequency-temperature characteristics of the quartz crystal resonator). Thus, particularly in this embodiment, the TCXO 230 is configured such that either a mode (TCXO mode) in which an oscillation signal having extremely high frequency accuracy is generated by performing temperature compensation or a mode (SPXO mode) in which an oscillation signal having low frequency accuracy is generated without performing temperature compensation can be selected through an external terminal (mode selecting terminal). In the TCXO mode, although the power consumption is high, a clock signal having extremely high frequency accuracy can be acquired. On the other hand, in the SPXO mode, although the frequency accuracy of the clock signal is low, the power consumption can be reduced. Such a TCXO 230, for example, can be realized by a piezoelectric oscillator according to any one of the above-described first to fourth embodiments.

According to this embodiment, by supplying a control signal to the mode selecting terminal of the TCXO 230 by using the baseband circuit 220, switching between the TCXO mode and the SPXO mode can be performed at an arbitrary timing, and the switching timings between the two modes are appropriately set in accordance with an application. For example, in a case where a navigation process in which the position information is updated every second is considered, during one second, it may be configured such that the RF circuit 210 performs the process only for the first 100 ms, and the baseband circuit 220 performs the process for the 900 ms following thereafter. In this case, the baseband circuit 220 may be configured to select the TCXO mode during a period during which the RF circuit 210 performs the process and select the SPXO mode during a period during which the baseband circuit 220 performs the process.

As above, the baseband circuit 220 generates a control signal used for controlling such that the power source voltage is supplied to the temperature compensation circuit of the TCXO 230 during a period during which the RF circuit 210 demodulates the IF signal from the GPS satellite signal and the power source voltage is not supplied to at least a part of the temperature compensation circuit (for example, some of a plurality of active circuits configuring the temperature compensation circuit) of the TCXO 230 in synchronization with a period during which a position calculating process is performed, and serves as a baseband processing unit according to an embodiment of the invention.

Examples of the electronic apparatus 400 include a cellular phone, a portable navigation device (PND), a PDA (Personal Data Assistant), a portable music player, a wrist watch, and the like.

2-3. Process of GPS Receiver Device

Figure 9:
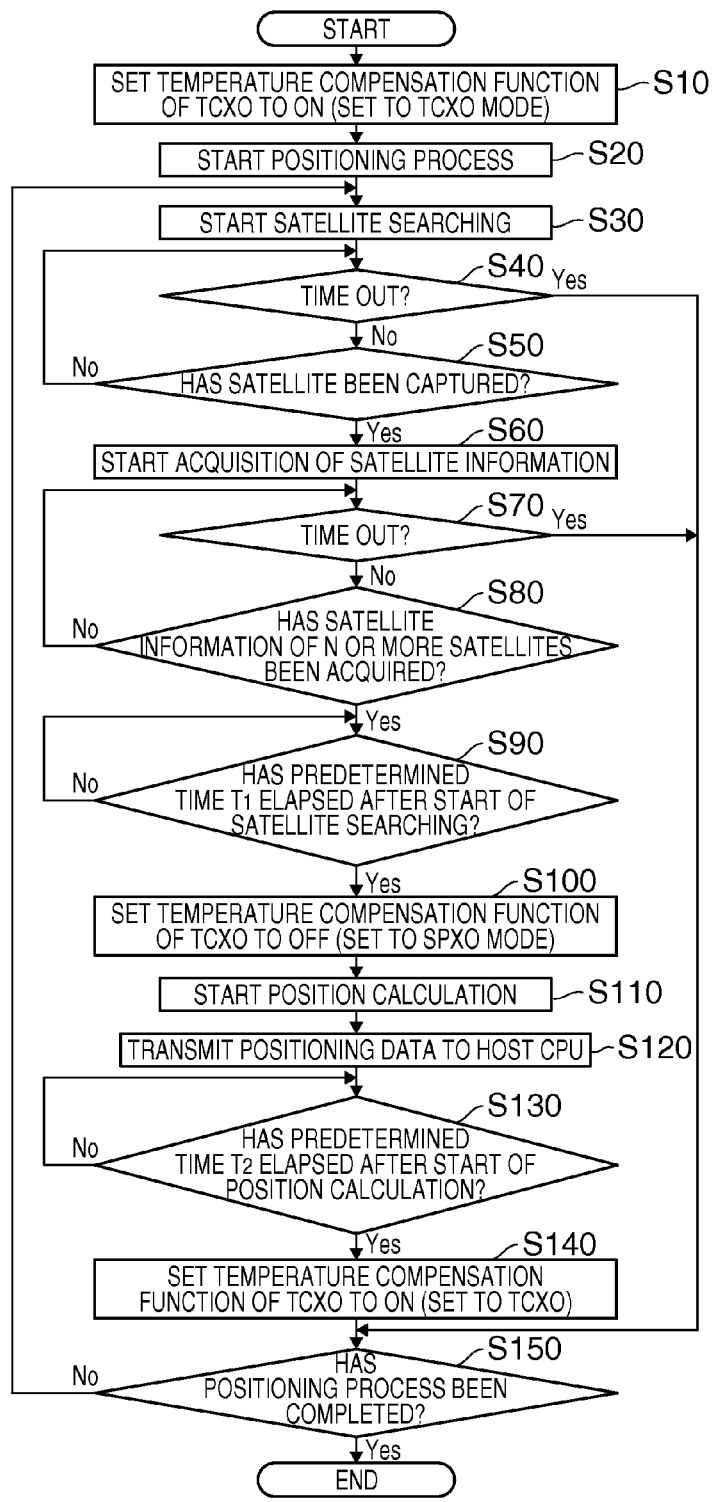
FIG. 9 is a flowchart showing an example of a concrete process of a GPS receiver device according to this embodiment.

FIG. 9 is a flowchart showing an example of a concrete process of the GPS receiver device according to this embodiment.

When receiving an instruction for performing a positioning process from the host CPU 300, the GPS receiver device 200 sets the temperature compensation function of the TCXO 230 to On (the TCXO mode is set) by using the baseband processing circuit 220 (Step S10) and starts the positioning process (Step S20).

The GPS receiver device 200, first, starts a satellite searching process (Step S30). In the satellite searching process, the GPS receiver device 200 performs a process of searching for GPS satellites that can be captured. To be more specific, in the satellite searching process, the RF circuit 210 receives GPS satellite signals and generates IF signals, the baseband circuit 220 demodulates baseband signals from the IF signals and generates a local code having the same pattern as that of the C/A code of each satellite number and calculates a correlation value between the C/A code included in the baseband signal and each local code. When the C/A code included in the baseband signal and the local code are the same, the correlation value has a peak at a predetermined timing. On the other hand, when the C/A code and the local code are not the same, the correlation value does not have any peak and is constantly almost zero. The baseband circuit 220 adjusts the generation timing of the local codes such that the correlation value between the C/A code included in the baseband signal and the local code becomes the maximum and determines that a GPS satellite is captured in a case where the correlation value is equal to or greater than a predetermined threshold value. The baseband circuit 220 stores the information (the satellite number or the like) of each captured GPS satellite in the SRAM 223.

In a case where a time-out time elapses before at least one GPS satellite is captured ("Yes" in Step S40), the GPS receiver device 200 continues to perform the satellite searching process (Step S30) unless a positioning process completing instruction is received from the host CPU 300 ("No" in Step S150). In a case where the electronic apparatus 400 has an environment in which a GPS satellite signal cannot be received, for example, in a case where the electronic apparatus 400 is placed indoors, no GPS satellite that can be captured is present even when all the GPS satellites are searched, and time-out occurs.

On the other hand, when a GPS satellite can be captured before the time-out time elapses (in the case of "Yes" in Step S50), the GPS receiver device 200 starts to acquire the satellite information (the time information, the orbit information, and the like) of the captured GPS satellites (Step S60). To be more specific, the baseband circuit 220 demodulates a navigation message transmitted from each captured GPS satellite so as to acquire the time information and the orbit information and stores the time information and the orbit information that have been acquired in the SRAM 223.

In a case where a time-out time elapses before the satellite information of N (for example, three or four) or more GPS satellites is acquired ("Yes" in Step S70), the GPS receiver device 200 continues to perform the satellite searching process (Step S30) unless a positioning process completing instruction is received from the host CPU 300 ("No" in Step S150). In a case where the GPS receiver device 200 cannot capture N (for example, three or four) or more GPS satellites or in a case where the reception level of the GPS satellite signal transmitted from the captured GPS satellite is too low, time-out occurs in the state in which the satellite information of N (for example, three or four) GPS satellites or more cannot be correctly demodulated.

On the other hand, in a case where the satellite information of N (for example, three or four) or more GPS satellites can be acquired before the time-out time elapses ("Yes" in Step S80), when a predetermined time $T_1$ elapses after the start of the satellite searching process ("Yes" in Step S90), the GPS receiver device 200 sets the temperature compensation function of the TCXO 230 to "Off" (the SPXO mode is set) by using the baseband processing circuit 220 (Step S100) and starts to calculate the position (Step S110). To be more specific, the baseband circuit 220 selects N (for example, three or four) GPS satellites from among the captured GPS satellites, reads out the satellite information (the time information and orbit information) of the selected N (for example, three or four) GPS satellites from the SRAM 223, and starts to calculate the position (generate position information) (Step S110).

To be more specific, the baseband circuit 220 calculates distances between the N (for example, three or four) GPS satellites and the electronic apparatus 400 based on a difference between the internal time and the time information and the time correction data, calculates the positions of the N GPS satellites based on the orbit information, and can generate the position information of the electronic apparatus 400 based on the distances between the N GPS satellites and the electronic apparatus 400 and the positions of the N GPS satellites.

After completing the calculation of the position, the GPS receiver device 200 transmits the positioning data (a result of calculation of the position, more particularly, the position information) to the host CPU 300 (Step S120).

Then, when a predetermined time $T_2$ elapses after the start of the position calculation process (in the case of "Yes" in Step S130), the GPS receiver device 200 sets the temperature compensation function of the TCXO 230 to "On" (the TCXO mode is set) by using the baseband processing circuit 220 (Step S140) and newly starts a satellite searching process for the next position calculation process (Step S30) unless a positioning process completing instruction is received from the host CPU 300 (in the case of "No" in Step S150).

The GPS receiver device 200 repeats the process of Step S30 and after that until receiving a positioning process completing instruction from the host CPU 300 (until "Yes" in Step S150).

According to this flowchart, during a period during which the RF circuit 210 demodulates the IF signal from the GPS satellite signal, by operating the TCXO 230 in the TCXO mode, a clock signal having extremely high frequency accuracy of about ±0.5 ppm can be supplied to the RF circuit 210.

On the other hand, during a period during which the baseband circuit 220 performs the position calculation process, even a clock signal having frequency accuracy of about ±100 ppm is sufficient, and accordingly, by operating the TCXO 230 in the SPXO mode, the power consumption can be reduced.

For example, in a navigation process in which the position information is updated within one second, by setting $T_1=100$ ms, and $T_2=900$ ms, the satellite information is acquired during the first 100 ms, and the calculation of the position is performed during the remaining 900 ms. In other words, the TCXO 230 is in the TCXO mode during the first 100 ms and is in the SPXO mode during the remaining 900 ms. Accordingly, in a case where the power consumption of the TCXO 230 can be reduced by 50% in the SPXO mode, since the time during which the TCXO 230 operates in the SPXO is 90%, the power consumption of the TCXO 230 can be reduced by 45% as a whole.

Figure 10:
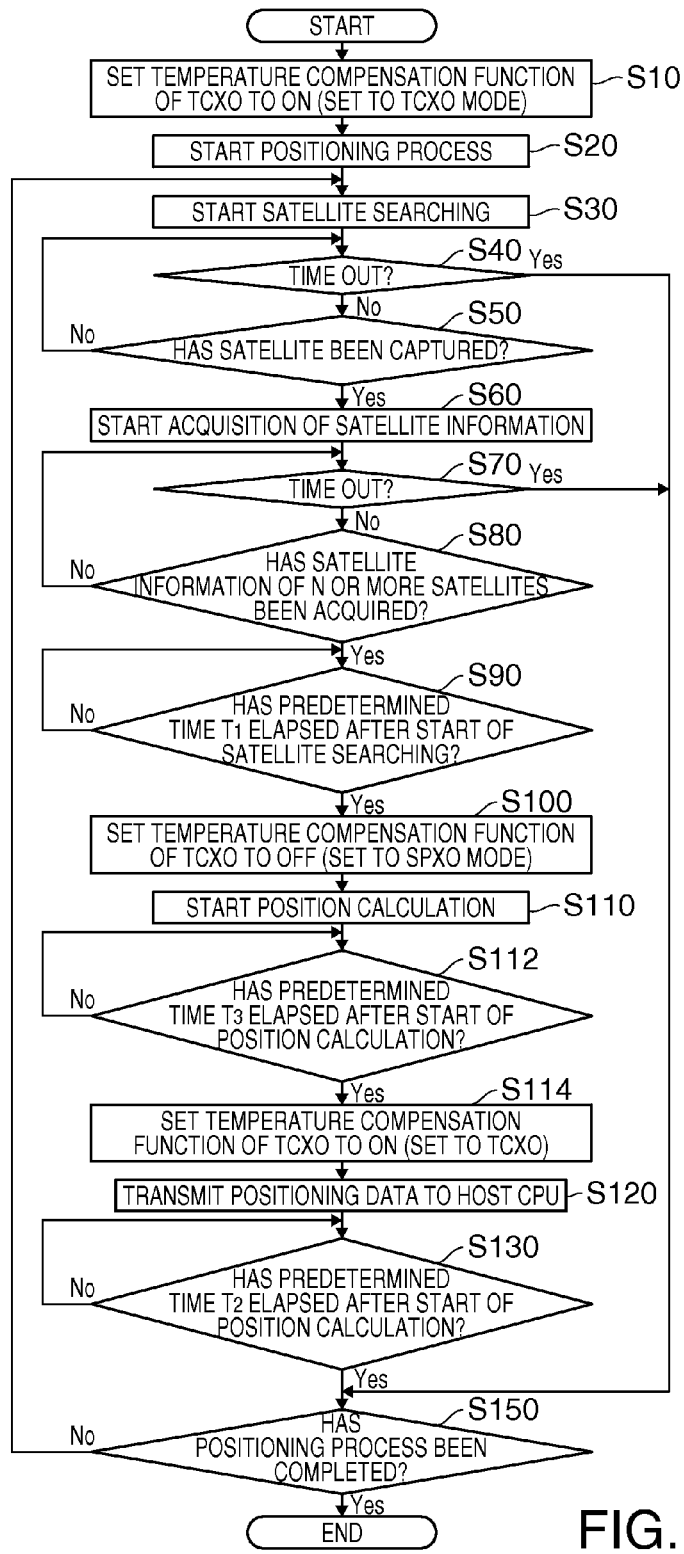
FIG. 10 is a flowchart showing another example of a concrete process of a GPS receiver device according to this embodiment.

FIG. 10 is a flowchart showing another example of a concrete process of the GPS receiver device according to this embodiment. In the flowchart shown in FIG. 9, immediately before the restart of the satellite searching process, the TCXO 230 is set to be in the TCXO mode. In such a case, when the temperature compensation circuit starts to operate by being supplied with the power source voltage in the TCXO mode, the circuit part of the TCXO 230 generates heat, and the heat is transferred to the quartz crystal resonator. However, it takes a little time for a temperature difference between the circuit part and the quartz crystal resonator to disappear. Accordingly, during a specific time period after the TCXO 230 is set to be in the TCXO mode, there is a difference between the detection temperature of the temperature sensor and the actual temperature of the quartz crystal resonator, and accordingly, the frequency accuracy of the TCXO 230 deteriorates. Accordingly, even when the satellite searching process is restarted, the GPS receiver device 200 cannot be immediately locked to the GPS satellite signal and performs an unnecessary process. Thus, in the flowchart shown in FIG. 10, from a predetermined time before the GPS receiver device 200 restarts the satellite searching process, the TCXO 230 is set to be in the TCXO mode. In the flowchart shown in FIG. 10, the same reference numerals are assigned to the same process as that shown in FIG. 9, and the description thereof is omitted.

In the flowchart shown in FIG. 10, the process of Steps S10 to S110 is the same as that of the flowchart shown in FIG. 9. In the flowchart shown in FIG. 10, when a predetermined time $T_3$ elapses after the GPS receiver device 200 starts to calculate the position ("Yes" in Step S112), the GPS receiver device 200 sets the temperature compensation function of the TCXO 230 to "On" (the TCXO mode is set) by using the baseband processing circuit 220 (Step S114).

Then, after the completion of the position calculation process, the GPS receiver device 200 transmits the positioning data (a result of the position calculation process, and more particularly, the position information) to the host CPU 300 (Step S120). Then, when the predetermined time $T_2$ elapses after the start of the position calculation process (in the case of "Yes" in Step S130), the GPS receiver device 200 newly starts a satellite searching process for the next position calculation (Step S30) unless a positioning process completing instruction is received from the host CPU 300 (in the case of "No" in Step S150).

According to this flowchart, by operating the TCXO 230 in the TCXO mode from a time $T_2-T_3$ before the RF circuit 210 starts the process, a clock signal having extremely high frequency accuracy of about ±0.5 ppm can be supplied to the RF circuit 210. Accordingly, by appropriately setting $T_2-T_3$, the process of the RF circuit 210 can be started after the power source voltage is supplied to the temperature compensation circuit of the TCXO 230, the heat generated by the temperature compensation circuit is transferred to the quartz crystal resonator, and a difference between the detection temperature of the temperature sensor and the temperature of the quartz crystal resonator disappears. Accordingly, the effects of the frequency error of the TCXO 230 due to a temperature difference between the detection temperature of the temperature sensor and the temperature of the quartz crystal resonator can be suppressed, and the process immediately after the start of the operation of the RF circuit 210 does not need to be invalidated.

For example, in a navigation process in which the position information is updated for each one second, by setting $T_1=100$ ms, $T_2=900$ ms, and $T_3=800$ ms, the TCXO 230 is in the TCXO mode 100 ms before the RF circuit 210 starts the process. When a difference between the detection temperature of the temperature sensor and the temperature of the quartz crystal resonator disappears during this 100 ms, the RF circuit 210 can be locked to the GPS satellite signal immediately after the start of the satellite searching process.

The invention is not limited to this embodiment, and various changes can be made therein within the scope of the concept of the invention.

For example, the piezoelectric oscillator 1D according to the fourth embodiment has a configuration acquired by adding the delay control circuit 120 to the piezoelectric oscillator 1A according to the first embodiment. However, a piezoelectric oscillator may be configured by adding the delay control circuit 120 to the piezoelectric oscillator 1B according to the second embodiment or the piezoelectric oscillator 1C according to the third embodiment. In a case where the delay control circuit 120 is added to the piezoelectric oscillator 1B according to the second embodiment, the delay control circuit 120 counts a predetermined time from when the state of the external terminal 4 is changed from the low level to the high level or the opened state (when the switch circuit 60 is closed) and controls the switch circuit 90 such that a constant voltage generated by the constant-voltage generating circuit 100 is supplied to the voltage-controlled oscillation circuit 30 before the elapse of a predetermined delay time, and the temperature compensation voltage is supplied to the voltage-controlled oscillation circuit 30 after the elapse of the predetermined delay time. In addition, the delay control circuit 120 controls the switch circuit 90 such that, when the state of the external terminal 4 is changed from the high level, the opened state, or the like to the low level (when the switch circuit 60 is opened), a constant voltage is immediately supplied to the voltage-controlled oscillation circuit 30. In a case where the delay control circuit 120 is added to the piezoelectric oscillator 1C according to the third embodiment, the delay control circuit 120 counts a predetermined time from when the state of the external terminal 4 is changed from the low level to the high level or the opened state (when the switch circuit 60 is closed) and controls so as to open all the switch circuits 112, 113, 114, and 115 disposed inside the temperature compensation circuit 110 before the elapse of a predetermined delay time and so as to close all the switch circuits 112, 113, 114, and 115 after the elapse of the predetermined delay time. In addition, the delay control circuit 120 controls so as to immediately open the switch circuits 112, 113, 114, and 115 when the state of the external terminal 4 is changed from the high level or the opened state to the low level (when the switch circuit 60 is opened).

In addition, for example, in the piezoelectric oscillator according to any one of the first to fourth embodiments, in a case where only the temperature compensation data is stored in the PROM 70, the supply of the power source voltage to the PROM 70 may be stopped in synchronization with stopping the supply of the power source voltage to the temperature compensation circuit 10. In such a case, the power consumption of the piezoelectric oscillator can be further reduced. However, in a case where the piezoelectric oscillator is used in the GPS receiver device 200 according to this embodiment, the clock signal needs to be supplied to the baseband circuit 220 also during a period (an operation stop period of the RF circuit 210) during which the supply of the power source voltage to the temperature compensation circuit 10 is stopped. Accordingly, in a case where capacity adjustment data of the inverter 32 or the like is stored in the PROM 70 together with the temperature compensation data, the supply of the power source voltage to the PROM 70 is preferably not stopped during the period during which the supply of the power source voltage to the temperature compensation circuit 10 is stopped.

The invention includes a configuration that is substantially the same as the configuration described in the embodiments (for example, a configuration having the same function, the same method and the same result, or a configuration having the same object and the same advantages). In addition, the invention includes a configuration in which a part that is not essential to the configuration described in the embodiments is replaced by another part. In addition, the invention includes a configuration that has the same operations and advantages as those described in the embodiments or a configuration that can achieve the same object. The invention includes a configuration acquired by adding known technologies to the configuration described in the embodiments.

The entire disclosure of Japanese Patent Application No. 2010-107016, filed May 7, 2010 is expressly incorporated by reference herein.

What is claimed is:

1. A piezoelectric oscillator comprising:
a piezoelectric resonator;
a storage unit that stores temperature compensation data used for specifying frequency-temperature characteristics of the piezoelectric resonator therein;
a temperature compensation circuit that acquires temperature information and generates a temperature compensation voltage used for compensating the frequency-temperature characteristics of the piezoelectric resonator based on the acquired temperature information and the temperature compensation data;
a voltage-controlled oscillation circuit that oscillates the piezoelectric resonator and controls an oscillation frequency of the piezoelectric resonator based on an oscillation control voltage; and
a power source control unit that controls so as to supply a power source voltage to the temperature compensation circuit or so as not to supply the power source voltage to at least a part of the temperature compensation circuit based on a control signal transmitted from the outside,
wherein the temperature compensation voltage is supplied as the oscillation control voltage to the voltage-controlled oscillation circuit in synchronization with a period during which the power source voltage is supplied to the temperature compensation circuit.

2. The piezoelectric oscillator according to claim 1, further comprising: a temperature compensation voltage control unit that controls so as to supply the temperature compensation voltage or a fixed voltage as the oscillation control voltage to the voltage-controlled oscillation circuit based on the control signal,
wherein the temperature compensation voltage control unit supplies the fixed voltage as the oscillation control voltage to the voltage-controlled oscillation circuit when the power source voltage is not supplied to at least a part of the temperature compensation circuit.

3. The piezoelectric oscillator according to claim 2,
wherein the temperature compensation voltage control unit maintains the temperature compensation voltage simultaneously at or before a time when the power source voltage is not supplied to at least a part of the temperature compensation circuit and supplies the temperature compensation voltage maintained as the fixed voltage to the voltage-controlled oscillation circuit when the power source voltage is not supplied to at least the part of the temperature compensation circuit.

4. The piezoelectric oscillator according to claim 2,
wherein the temperature compensation voltage control unit supplies a predetermined constant voltage as the fixed voltage to the voltage-controlled oscillation circuit when the power source voltage is not supplied to at least a part of the temperature compensation circuit.

5. The piezoelectric oscillator according to claim 1,
wherein the temperature compensation circuit includes:
a plurality of voltage generating circuits that generates voltages used for compensating terms of each order number of a polynomial expression that approximates the frequency-temperature characteristics of the piezoelectric resonator based on the temperature information and the temperature compensation data; and
a temperature compensation voltage generating circuit that generates the temperature compensation voltage based on the voltages generated by the plurality of voltage generating circuits,
wherein the power source control unit controls whether to supply the power source voltage to the voltage generating circuits that generate the voltages used for compensating the first-order or higher terms of the polynomial expression based on the control signal, and
wherein the temperature-compensated voltage generating circuit supplies a voltage used for compensating the 0-th order term of the polynomial expression as the oscillation control voltage to the voltage-controlled oscillation circuit when the power source voltage is not supplied to the voltage generating circuits that generate the voltages used for compensating the first order and higher terms of the polynomial expression.

6. The piezoelectric oscillator according to claim 1, further comprising: a delay control unit that controls a delay time until the temperature compensation voltage is supplied to the voltage-controlled oscillation circuit after a state in which the power source voltage is not supplied to at least a part of the temperature compensation circuit changes to a state in which the power source voltage is supplied to the temperature compensation circuit.

7. A GPS receiver device comprising:
the piezoelectric oscillator according to claim 1;
a reception unit that receives electric wave signals from GPS satellites;
an RF processing unit that demodulates a signal in an intermediate frequency band from the electric wave signal based on an oscillation signal of the piezoelectric oscillator; and
a baseband processing unit that demodulates a baseband signal from the signal in the intermediate frequency band based on the oscillation signal of the piezoelectric oscillator and performs a predetermined calculation process by extracting predetermined information from the baseband signal, wherein the baseband processing unit generates a control signal used for controlling so as to supply the power source voltage to the temperature compensation circuit of the piezoelectric oscillator during a period during which the RF processing unit demodulates the signal in the intermediate frequency band from the electric wave signal and controlling so as not to supply the power source voltage to at least a part of the temperature compensation circuit of the piezoelectric oscillator in synchronization with a period during which the calculation process is performed and supplies the control signal to the piezoelectric oscillator.

8. The GPS receiver device according to claim 7, wherein the baseband processing unit generates the control signal used for controlling so as to supply the power source voltage to the temperature compensation circuit a predetermined time before time when the RF processing unit starts to perform a process of demodulating the signal in the intermediate frequency band from the electric wave signal.

9. An electronic apparatus comprising the GPS receiver device according to claim 7.

* * * * *